Sept. 15, 1959 M. E. PARADISE 2,904,613
LARGE AREA SOLAR ENERGY CONVERTER AND METHOD FOR MAKING THE SAME
Filed Aug. 26, 1957

MAURICE E. PARADISE
INVENTOR.
BY Bruce L. Birchard
HIS ATTORNEY

United States Patent Office 2,904,613
Patented Sept. 15, 1959

2,904,613

LARGE AREA SOLAR ENERGY CONVERTER AND METHOD FOR MAKING THE SAME

Maurice Elliott Paradise, Highland Park, Ill., assignor to Hoffman Electronics Corporation, Los Angeles, Calif., a corporation of California Application August 26, 1957, Serial No. 680,160

12 Claims. (Cl. 136—89)

This invention relates to improvements in electromagnetic energy converting apparatus and, more particularly, to devices for converting solar energy directly into electrical energy and to processes for making such devices.

In the present state of the art the most efficient photoelectric energy converters are made from specially prepared silicon of the type commonly used for manufacturing transistors and semiconductor diodes. The steps involved in making the present day silicon solar energy converters include the melting of hyperpure silicon in furnaces of the resistance or induction type, doping the melt with an electron donor such as arsenic, drawing a single crystal of silicon by a relatively slow and tedious method, slicing the single crystal ingot into discs, diffusing an electron acceptor material such as boron into the surfaces of the disc, removing the diffused silicon in certain regions with appropriate masking and etching techniques, and applying the positive electrode to the acceptor diffused surface and the negative electrode to the remaining surface. The latter process of applying connectors or terminals may involve an intermediate step of plating nickel before the final step of solder dipping, so as to assure a good electrical and mechanical bond to the silicon slice. This technique for preparing silicon solar energy converters is attributed, generally, to Bell Laboratories and is covered by various technical publications from that organization and others.

The cost of such solar energy converters is sufficiently high to prohibit their use in many applications where, except for the adverse economic factor, their use would be clearly indicated. The high cost of the solar energy converters presently available is inherent in the material and labor costs and material losses involved in the technique which has been broadly described. If a significant reduction in the cost of the solar energy converters could be effected, it is anticipated that such converters would have an important technological and sociological impact upon the inhabitants of the United States and many foreign countries.

Therefore, it is an object of this invention to provide a relatively low cost process for producing solar energy converters and a correspondingly low cost solar energy converter product.

It is a further object of this invention to provide a process for producing large area relatively low cost solar energy converters and a correspondingly large area converter product.

It is a still further object of this invention to provide a large area solar energy converter which provides a high efficiency of photoelectric conversion despite the largeness of the converter area.

It is an additional object of this invention to provide a relatively low cost high efficiency large area solar energy converter which may be divided or cut to provide a converter of a desired power output.

According to the present invention, hyperpure semiconductor material such as silicon in chunk form is ball milled or ground into fine particles or crystallites having dimensions in the order of 2 mm., such ground particles having an electron acceptor material diffused a predetermined distance into the entire outer surface of each particle. Such particles are mixed with a plastic material such as polyethylene having electrical insulating properties so that each particle is encased in an insulating medium. The particles in the insulating medium are applied to a reinforcing plate or other supporting surface, planar or otherwise, which may be of metal, ceramic, or other stiff material. The mixing process may be a separate step before application to the reinforcing plate or the plastic material may be applied to the reinforcing plate and the semiconductor particles blown, rolled or otherwise introduced into the plastic layer. The surface of the sandwich most remote from the reinforcing plate is then etched with an appropriate etching solution such as one combining hydrofluoric and nitric acid until the faces of the crystallites adjacent the upper surface of the sandwich are exposed and the electron acceptor diffused layer is removed in this area exposing "N" silicon. The exposed silicon or other semi-conductor is then plated with a material such as nickel which gives a good mechanical and electrical bond to the semiconductor, solder is applied over the plated surface and a continuous base plate is sweated onto the solder covered negative surface.

The reinforcing plate is stripped from the opposite surface of the sandwich exposing the plastic material adjacent the surface of which are the electron acceptor areas of the silicon crystallites. By selective etching using, for example, nitric acid a portion of the insulating material is removed and the desired electron acceptor area is exposed. A flash of nickel may be applied to the now exposed "P" layer and solder may then be applied to the plated surfaces by spraying, dipping or other appropriate techniques to produce electrical connections between adjacent electron-acceptor-diffused crystallite areas. An additional selective etching step is then undertaken to remove the solder and nickel plating from areas of the diffused silicon upon which it is intended that light impinge. Such etching is continued until such exposed areas are maximized but not beyond the point where the conductivity of the over-all network of the connections formed by the process is impaired. Connections to the grid thus formed will provide the positive terminal of the converter. By this technique a large area solar energy converter may be realized which will not suffer from high internal $I^2R$ losses or sacrifice of important active areas.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
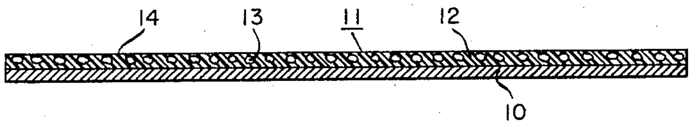
Figure 1 is a cross-sectional view showing the product according to this invention after only a few preliminary steps in the process have been performed.

In Figure 1 supporting surface 10 may be of metal, ceramic or other material resistant to plastic solvents. Layer 11 comprises a binder material 12 represented by the hatched portion in which are imbedded particles 13 of a semiconductor material such as silicon. The characteristics of binder 12 are that it is a good electrical insulator and that it may be applied to supporting surface or reinforcing plate 10 in a plastic condition but will set or harden so as to be self-supporting within a reasonable time. The material of binder 12 may be polyethylene, for example.

Particles 13 are formed by taking chunks of semiconductor material of sufficiently high purity so as not to be degenerate in a semiconductor sense, grinding or ball milling the chunks using crushing or ball milling apparatus made of marble or other material that will not poison the surfaces of the crushed particles and diffusing the particles over their entire surfaces with a material that has the opposite electron acceptance characteristics from the semiconductor particles themselves. To be specific, chunks of hyperpure silicon, for example, having "N" characteristics may be ball milled to a size of approximately 2 mm. and the particles or crystallites so formed may be diffused with boron by exposing the particles in a rotating furnace into which boron trichloride has been introduced. The temperature of the furnace should be maintained at approximately 1100° C. until the boron has diffused about one ten-thousandths of an inch into the surface of the N silicon particles. Binder 12, of polyethylene, for example, may be painted or sprayed upon the surface of reinforcing plate 10 and, while binder 12 is still in a plastic condition, particles 13 may be rolled or blown into the binder after the diffusion process previously described has been completed. As an alternative, particles 13 after diffusion may be mixed in a container with binder 12 and the composite material painted or sprayed upon the surface of reinforcing plate 10.

When the binder 12 has hardened, the sandwich shown in Figure 1 will comprise a reinforcing plate 10 secured to which is a hardened layer of binder 12 contained in which will be a multiplicity of particles or crystallites of boron diffused N silicon, each particle or crystallite being electrically insulated from every other particle or crystallite.

Figure 2:
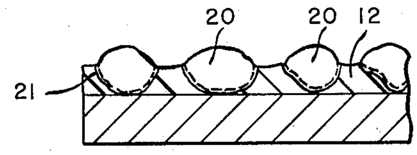
Figure 2 is an enlarged view of a portion of the device shown in Figure 1 after an additional step in the process according to this invention has been performed.

Upper surface 14 of layer 11 is then placed in contact with an etching solution which may comprise a solution of nitric and hydrofluoric acids, the depth of etching being less than the shortest particle dimension normal to reinforcing plate 10. The etching removes both the binder material and the boron diffused silicon layer, where silicon is the base material and boron is the diffused material, exposing N-type silicon at 20 in Figure 2 and retaining a boron diffused region 21 intact and still imbedded in binder 12.

Exposed N regions are then plated with metallic nickel as by the chemical process which involves immersing regions 20 in a bath containing a nickel chloride, sodium hypophosphate, ammonium citrate, ammonium chloride and ammonium hydroxide, this process being well known in the art. Heated solder is then sprayed on the plated regions 20, or a dip soldering technique may be used.

Figures 3, 4:
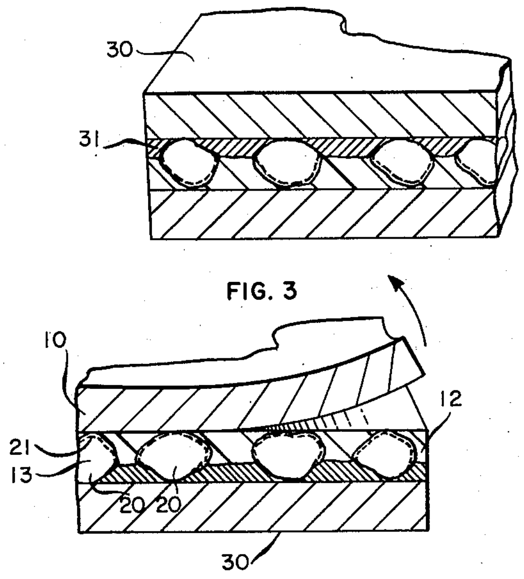
Figure 3 shows the product according to this invention after additional steps in its manufacture have been taken.
Figure 4 shows a later step in the process according to this invention.

Connector element 30 appearing in Figure 3 is then applied using heat so that connector plate 30 is sweated into electrical connection with each region 20 on the individual crystallites or particles. It is to be noted that the application of solder layer 31 helps to compensate for any irregularity in the degree of protrusion of the various regions 20 of the individual particles.

Reinforcing plate 10 is then removed as shown in Figure 4 leaving regions 20 of particles 13 soldered to connector plate 30 and particles 13 separated from each other by insulating binder 12. Reinforcing plate 10 may be simply stripped off by mechanical means or, if desired, etched away in an appropriate solution. Binder 12 is then removed by the use of a solvent to the degree that P regions 21 are exposed. A flash or thin plating of nickel may then be deposited on regions 21 by the chemical deposition method previously described, for example, Melted solder is then applied to the regions 21 and to the interstices between adjacent regions 21 by spraying or dipping techniques. Supersonic soldering techniques may be utilized and the plating process eliminated. For operation of the sandwich as a photoelectric converter, it is necessary that the plating and solder be removed from the major portions of regions 21 so that they are exposed to incident radiation. This is accomplished by selective etching in a solution of nitric and hydrofluoric acids of controlled concentration, for example. This etching process is continued until regions 21 have maximum exposure without sacrifice of the conductivity between adjacent regions 21 afforded by the solder which has been applied. Control is effected by measuring the conductivity between opposite extremities of the solder grid interconnecting regions 21 as the etching process is conducted. The sandwich now takes the form shown in Figure 5 and a positive terminal may be connected to interconnecting solder grid 50 while a negative terminal may be connected to conductor plate 30.

In the fabrication of the converter sandwich or panel care must be taken so that at no point in the sandwich is there a direct ohmic connection between regions 20 and regions 21, respectively. Such a direct ohmic connection would short circuit the converter and would result in no electrical output between terminals 51 and 52.

Figure 5:
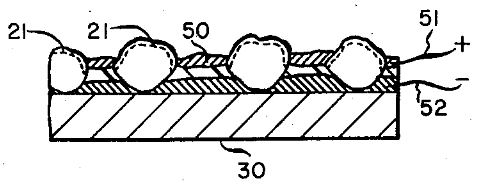
Figure 5 shows the product according to this invention after all the steps of the process have been completed.

The structure of Figure 5 operates as follows. A P–N junction exists about one ten-thousandths of an inch below the outer surface of each region 21. The mechanics of a P–N junction are, today, well known and will not be dwelt upon at length. One characteristic of such a junction is, however, that an inherent electrical field exists across the junction and when light shines upon the individual regions 21 of Figure 5 at least some of the photons making up the light energy will strike and be absorbed in the region of the P–N junction. Most of these photons will have the appropriate energy level to break a valence bond and create a hole-electron pair. Because of the inherent electrical field to which reference has already been made, the holes thus generated will flow towards the P-type material and the electrons towards the N-type material. This selective migration of holes and electrons will produce an external voltage which may be measured between electrodes 51 and 52. Connection of an external load to these electrodes will result in a current flow through the load. In essence, then each particle 20 acts as a photoelectric converter and all such converters are connected in parallel by reason of the disposition of conductor plate 30, which is in contact with the N-type material and the disposition of solder grid 50 which is in contact with all the regions of P-type material. The high conductivities of solder grid 50 and plate 30 minimize $I^2R$ losses in the converter which would normally be quite sizable as a result of the large area contemplated for the converter and the consequent long current paths. It should be noted that the problem of converter efficiency loss often encountered when polycrystalline material is used for the converter is minimized in the subject invention by the step of crushing or ball billing the chunks of semiconductor material to a size where the number of possible crystal interfaces is a minimum. This eliminates the tedious and expensive process of single crystal growing and slicing formerly utilized in the fabrication of solar energy converters.

Thus, there has been provided by this invention a relatively inexpensive process and a correspondingly inexpensive product derived from that process, that product being a photoelectric converter of potentially large area and reasonable conversion efficiency, thus making feasible the wide-spread use of solar energy converted to electrical energy for powering many domestic devices as well as for powering communications and signalling equipment.

It should be noted that although reference has been made for convenience purposes to the use of silicon as the semiconductor material, the invention is equally applicable to other materials such as germanium and intermetallics such as gallium arsenide and silicon carbide.

Further, the semiconductor base material may be of a P-type rather than an N-type as described herein, in which case in electron donor material such as arsenic or phosphorus would be diffused into region 21 to form an N–P junction.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. The process for producing a photoelectric converter which includes the steps of pulverizing semiconductor material of a first type, treating the surface of each particle of such pulverized material with an impurity to produce a surface layer of semiconductor material of the opposite type, providing upon a supporting surface a layer including such treated pulverized material and an electrically insulating binder interposed between respective particles, etching away said surface layer of opposite type over a corresponding portion of each of said particles to leave exposed regions of said first type, and interconnecting said regions of said first type and said regions of said opposite type, respectively.

2. The process for producing a photoelectric converter which includes the steps of pulverizing semiconductor material of a first type, diffusing into the surface of each particle of such pulverized material an impurity to produce a surface layer of semiconductor material of the opposite type, applying a layer of plastic, electrically insulating binder to a stiffening plate, introducing said particles of pulverized semiconductor material into said binder while said binder is still in a plastic condition, etching away said surface layer of opposite type over a corresponding portion of each of said particles to leave exposed regions of said first type, and interconnecting said regions of said first type and said regions of said opposite type, respectively.

3. The process for producing a photoelectric converter which includes the steps of pulverizing semiconductor material of a first type, diffusing into the surface of each particle of such pulverized material an impurity to produce a surface layer of semiconductor material of the opposite type, applying a layer of plastic, electrically insulating binder to a stiffening plate, blowing said particles of pulverized semiconductor material into said binder while said binder is still in a plastic condition, etching away said surface layer of opposite type over a corresponding portion of each of said particles to leave exposed regions of said first type, and interconnecting said regions of said first type and said regions of said opposite type, respectively.

4. The process for producing a photoelectric converter which includes the steps of pulverizing semiconductor material of a first type, diffusing into the surface of each particle of such pulverized material an impurity to produce a surface layer of semiconductor material of the opposite type, applying a layer of plastic, electrically insulating binder to a stiffening plate, rolling said particles of pulverized semiconductor material into said binder while said binder is still in a plastic condition, etching away said surface layer of opposite type over a corresponding portion of each of said particles to leave exposed regions of said grst type, and interconnecting said regions of said first type and said regions of said opposite type, respectively.

5. The process for producing a photoelectric converter which includes the steps of pulverizing semiconductor material of a first type, diffusing into the surface of each particle of such pulverized material an impurity to produce a surface layer of semiconductor material of the opposite type, mixing said particles with an electrically insulating binder and applying a layer of the mixture so formed to a stiffening plate, etching away said surface layer of opposite type over a corresponding portion of each of said particles to leave exposed regions of said first type, and interconnecting said regions of said first type and said regions of said opposite type, respectively.

6. The process for producing a photoelectric converter which includes the steps of pulverizing semiconductor material of a first type, diffusing into the surface of each particle of such pulverized material an impurity to produce a surface layer of semiconductor material of the opposite type, providing upon a stiffening plate a layer including such diffused pulverized material and an electrically insulating binder interposed between respective particles, etching away said surface layer of opposite type over a corresponding portion of each of said particles to leave exposed regions of said first type, interconnecting said exposed regions of said first type, removing said stiffening plate and a portion of said binder to expose particle regions of said opposite type, and interconnecting said exposed regions of said opposite type.

7. The process for producing a photoelectric converter which includes the steps of pulverizing semiconductor material of a first type, diffusing into the surface of each particle of such pulverized material an impurity to produce a surface layer of semiconductor material of the opposite type, providing upon a stiffening plate a layer including such diffused pulverized material and an electrically insulating binder interposed between respective particles, etching away said surface layer of opposite type over a corresponding portion of each of said particles to leave exposed regions of said first type, plating said exposed regions of said first type, applying solder to said plated regions, sweating a conductive plate into an electrical and mechanical bond with said solder covered plated regions, removing said stiffening plate and a portion of said binder to expose particle regions of said opposite type, and interconnecting said exposed regions of said opposite type.

8. The process for producing a photoelectric converter which includes the steps of pulverizing semiconductor material of a first type, diffusing into the surface of each particle of such pulverized material an impurity to produce a surface layer of semiconductor material of the opposite type, providing upon a stiffening plate a layer including such diffused pulverized material and an electrically insulating binder interposed between respective particles, etching away said surface layer of opposite type over a corresponding portion of each of said particles to leave exposed regions of said first type, plating said exposed regions of said first type, applying solder to said plated regions, sweating a conductive plate into an electrical and mechanical bond with said solder-covered plated regions, removing said stiffening plate and a portion of said binder to expose particle regions of said opposite type, plating said exposed regions of opposite type, applying solder to said plated regions to interconnect the same, and etching away excess solder and plating to expose a substantial portion of each region of opposite type while retaining such interconnection.

9. A photoelectric converter including a plurality of semiconductor particles electrically insulated from each other, each particle having a region of a first type and a region of a second type, said regions of the first type having generally a first direction, said regions of said second type having generally a second direction, a conductive plate interconnecting said regions of a first type and electrical connections between said regions of said second type.

10. A photoelectric converter including a plurality of semiconductor particles electrically insulated from each other, each particle having a region of a first type and a region of a second type, said regions of the first type having generally a first direction, said regions of said second type having generally a second direction, a conductive plate interconnecting said regions of a first type and a conductive grid interconnecting said regions of said second type.

11. A photoelectric converter including a conductive metallic base portion, a plurality of semiconductor crystallite particles each having an N-type region and a P-type region contiguous with said N-type region, said base portion being electrically and mechanically bonded to said N-type regions, a conductive grid interconnecting said P-type regions, and an insulating binder separating said crystallite particles.

12. A photoelectric converter including a metal base, a plurality of silicon particles of the N-type each having a diffused surface region of P-type thereon and a remaining surface region of N-type, each region of said P-type being similarly directed on each particle, a binder electrically insulating each particle from the other, said metal base being electrically and mechanically bonded to said N-type region of each particle, and a conductive grid interconnecting a portion of each P-type region to a portion of every other P-type region.

References Cited in the file of this patent

UNITED STATES PATENTS 2,423,125 Teal ---------------------- July 1, 1947

OTHER REFERENCES

Richtmeyer, F. K., and Kennard, E. H.: "Introduction to Modern Physics," McGraw-Hill, New York, 1947, Library Call No. QC 21 R 5, 1947.